(12) United States Patent
Kwon et al.

(10) Patent No.: US 10,908,505 B2
(45) Date of Patent: Feb. 2, 2021

(54) PHOTORESIST DEVELOPER COMPOSITION AND MANUFACTURING METHOD OF SEMICONDUCTOR PACKAGE USING THE SAME

(71) Applicant: SAMSUNG ELECTRONICS CO., LTD., Suwon-si (KR)

(72) Inventors: Sang Hyun Kwon, Suwon-Si (KR); Jin Hee Hwang, Suwon-Si (KR); Seong Chan Park, Suwon-Si (KR); Young Ju Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 205 days.

(21) Appl. No.: 16/101,883

(22) Filed: Aug. 13, 2018

(65) Prior Publication Data

US 2019/0204746 A1 Jul. 4, 2019

(30) Foreign Application Priority Data

Jan. 2, 2018 (KR) .................. 10-2018-0000412

(51) Int. Cl.
*G03F 7/32* (2006.01)

(52) U.S. Cl.
CPC .............. *G03F 7/327* (2013.01); *G03F 7/322* (2013.01)

(58) Field of Classification Search
CPC ........................................................ G03F 7/32
See application file for complete search history.

(56) References Cited

U.S. PATENT DOCUMENTS

2019/0136161 A1* 5/2019 Kamimura ............... C11D 7/10

FOREIGN PATENT DOCUMENTS

| KR | 10-2016-0121205 A | 10/2016 |
| KR | 10-2017-0086965 A | 7/2017 |
| TW | 201621480 A | 6/2016 |
| WO | 2017/038598 A1 | 3/2017 |
| WO | 2017/126554 A1 | 7/2017 |

* cited by examiner

*Primary Examiner* — Kathleen Duda
(74) *Attorney, Agent, or Firm* — Sughrue Mion, PLLC

(57) ABSTRACT

A photoresist developer composition contains: a quaternary alkyl ammonium compound; and a corrosion inhibitor. The corrosion inhibitor contains a silane-based compound and an azole-based compound A manufacturing method of a semiconductor package includes using the photoresist developer composition.

18 Claims, 10 Drawing Sheets

PHOTORESIST DEVELOPER COMPOSITION AND MANUFACTURING METHOD OF SEMICONDUCTOR PACKAGE USING THE SAME

CROSS-REFERENCE TO RELATED APPLICATION(S)

This application claims benefit of priority to Korean Patent Application No. 10-2018-0000412 filed on Jan. 2, 2018 in the Korean Intellectual Property Office, the disclosure of which is incorporated herein by reference in its entirety.

TECHNICAL FIELD

The present disclosure relates to a developer composition used in photolithography, a core process in a manufacturing process of an electronic component.

BACKGROUND

Photolithography is a core process in a manufacturing process of an electronic component such as a semiconductor or a liquid crystal display (LCD) panel. Generally, photolithography is performed by exposing and developing a photoresist.

Meanwhile, as a developer of the photoresist, a strong alkaline solution has widely been used. However, a pad of the electronic component such as a semiconductor chip is generally formed of a metal such as aluminum (Al), and when an exposed portion of such a metal is exposed to a strong alkaline solution, the developer solution, a microcircuit or the pad may be corroded or significantly damaged.

SUMMARY

An aspect of the present disclosure may provide a novel developer composition capable of effectively developing a photoresist while selectively protecting a metal wiring or metal pad formed of aluminum (Al) or copper (Cu).

One of several technical solutions suggested in the present disclosure is to use a quaternary alkyl ammonium compound to which a corrosion inhibitor containing a silane-based compound is added.

According to an aspect of the present disclosure, a photoresist developer composition according to an exemplary embodiment may contain: a quaternary alkyl ammonium compound; and a corrosion inhibitor. The corrosion inhibitor may contain a silane-based compound and an azole-based compound. If necessary, the photoresist developer composition may further contain a surfactant, a solvent, other additives, or the like.

According to another aspect of the present disclosure, a manufacturing method of a semiconductor package may include: preparing a semiconductor chip having an active surface on which connection pads are disposed and an inactive surface opposing the active surface; forming a photoresist on the active surface of the semiconductor chip and exposing the photoresist; and developing the exposed photoresist. In the developing of the photoresist, the photoresist developer composition described above may be used.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in present disclosure will be described with reference to the accompanying drawings. In the accompanying drawings, shapes, sizes, and the like, of components may be exaggerated or shortened for clarity.

Electronic Device

Figure 1:
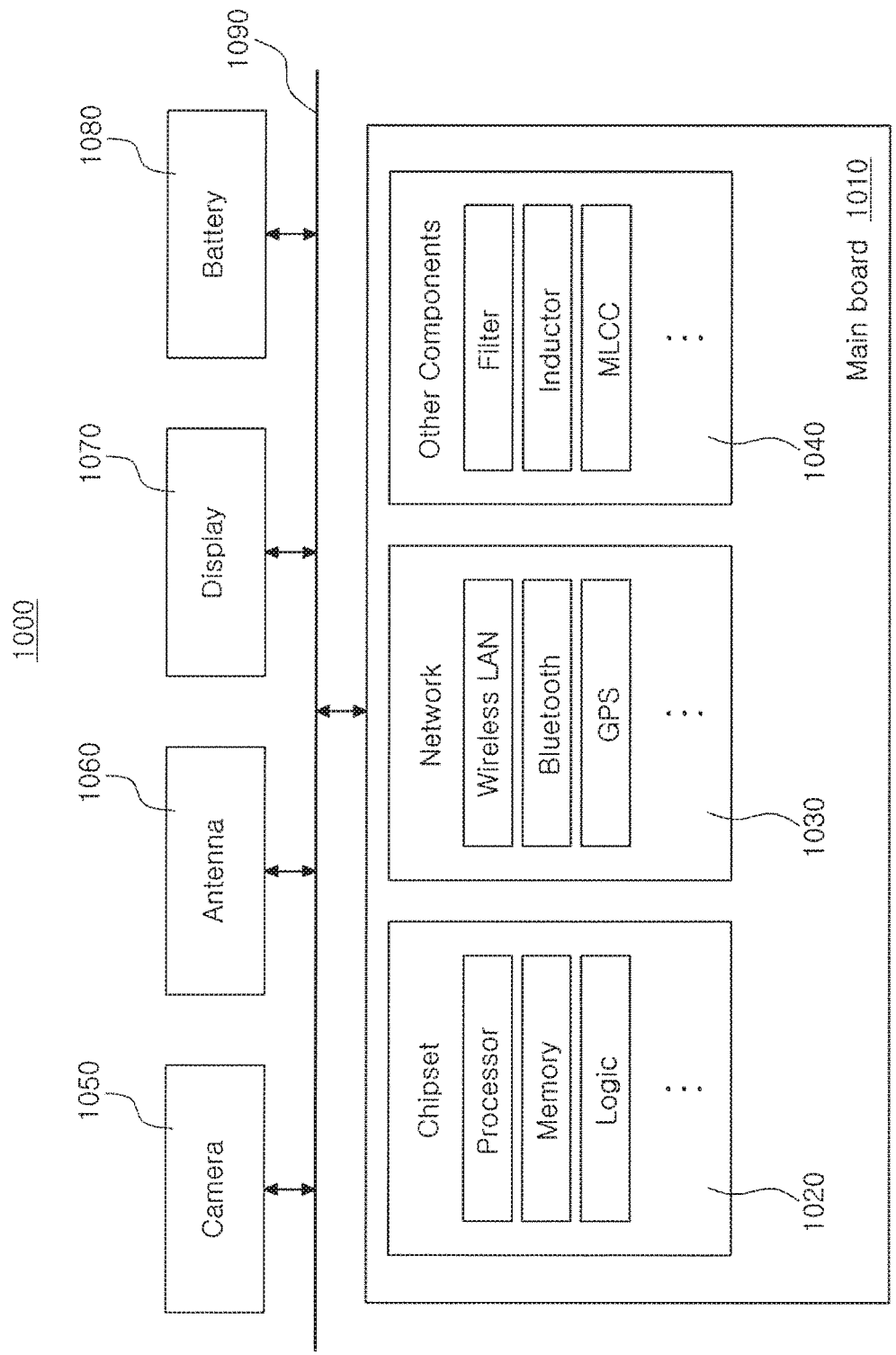
FIG. 1 is a block diagram schematically illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be coupled to others to be described below to form various signal lines 1090.

The chip related components 1020 may include a memory chip such as a volatile memory (for example, a dynamic random access memory (DRAM)) a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. Further, these chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+(HSDPA+), high speed uplink packet access+ (HSUPA+), enhanced data GSM environment. (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the above-mentioned protocols. However, the network related components 1030 are not limited thereto, but may also include a variety of other wireless or wired standards or protocols. Further, the network related components 1030 may be combined with each other, together with the above-mentioned chip related components 1020.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. Further, other components 1040 may be combined with each other, together with the chip related components 1020 and/or the network related components 1030.

Depending on a type of the electronic device 1000, the electronic device 1000 may include other components that may be or may not be physically and/or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated) a speaker (not illustrated), mass storage unit (for example, hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may also be any other electronic device processing data.

Figure 2:
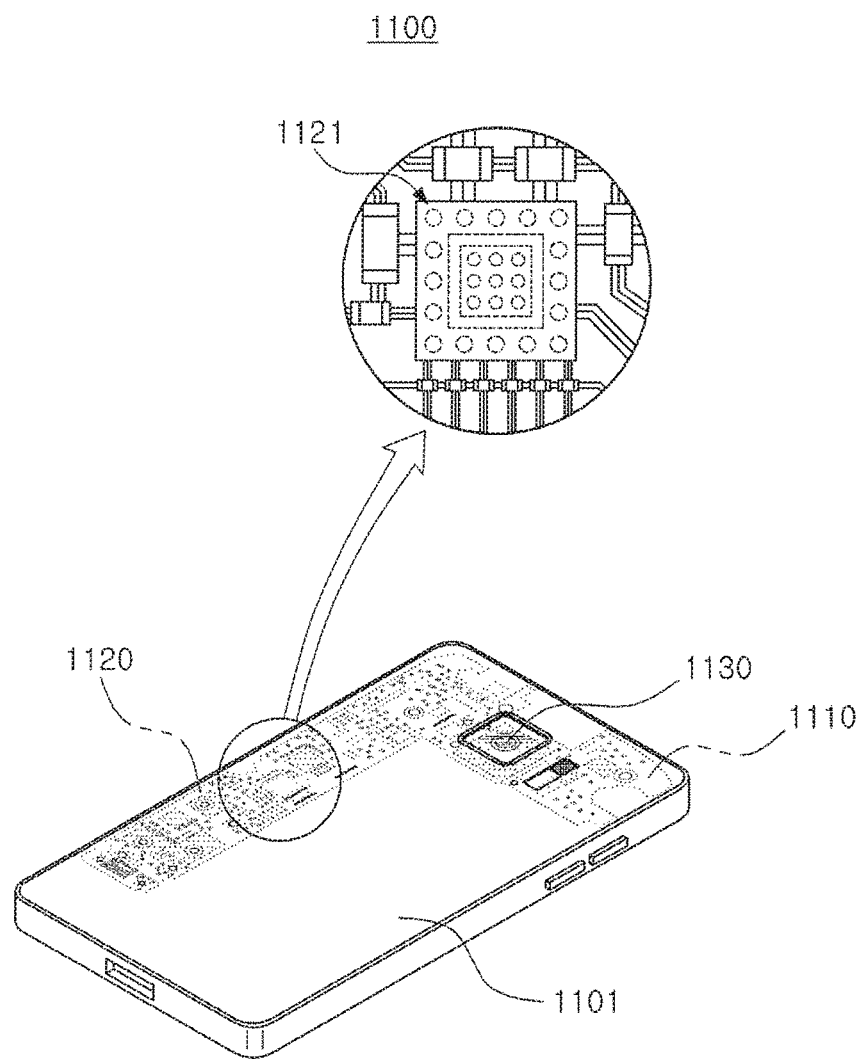
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various components 1120 may be physically and/or electrically connected to the motherboard 1110. Further, another component that may be or may not be physically and/or electrically connected to the mainboard 1110, such as, a camera 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
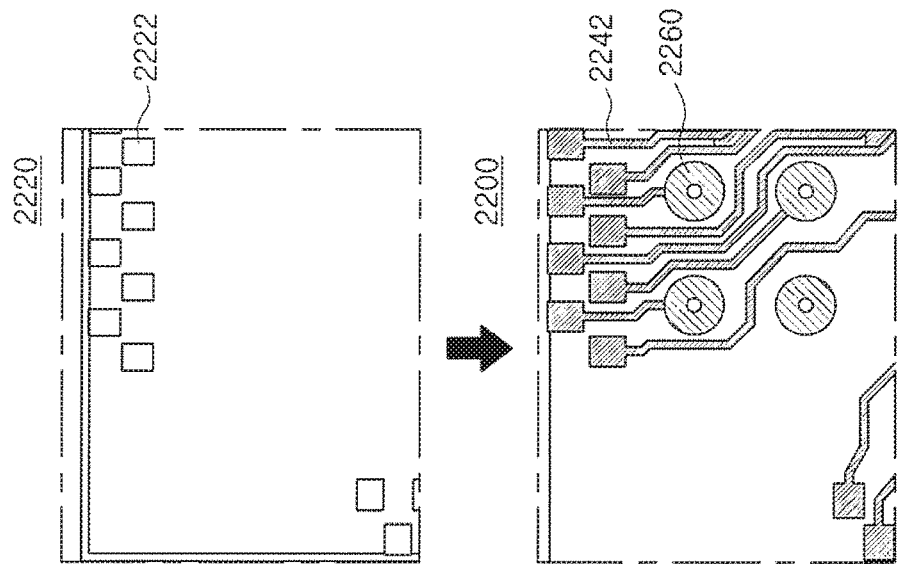
FIGS. 3A and 3B are schematic cross-sectional views illustrating states of a fan-in semiconductor package before and after being packaged.
Figure 3A:
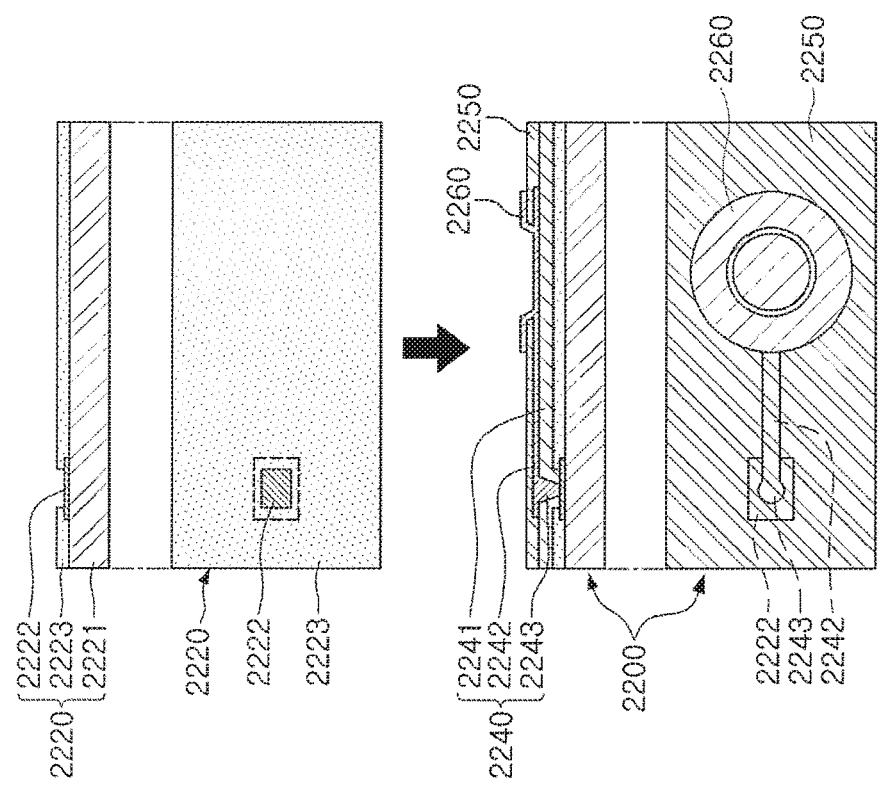

FIGS. 3A and 35 are schematic cross-sectional views illustrating states of a fan-in semiconductor package before and after being packaged.

Figure 4:
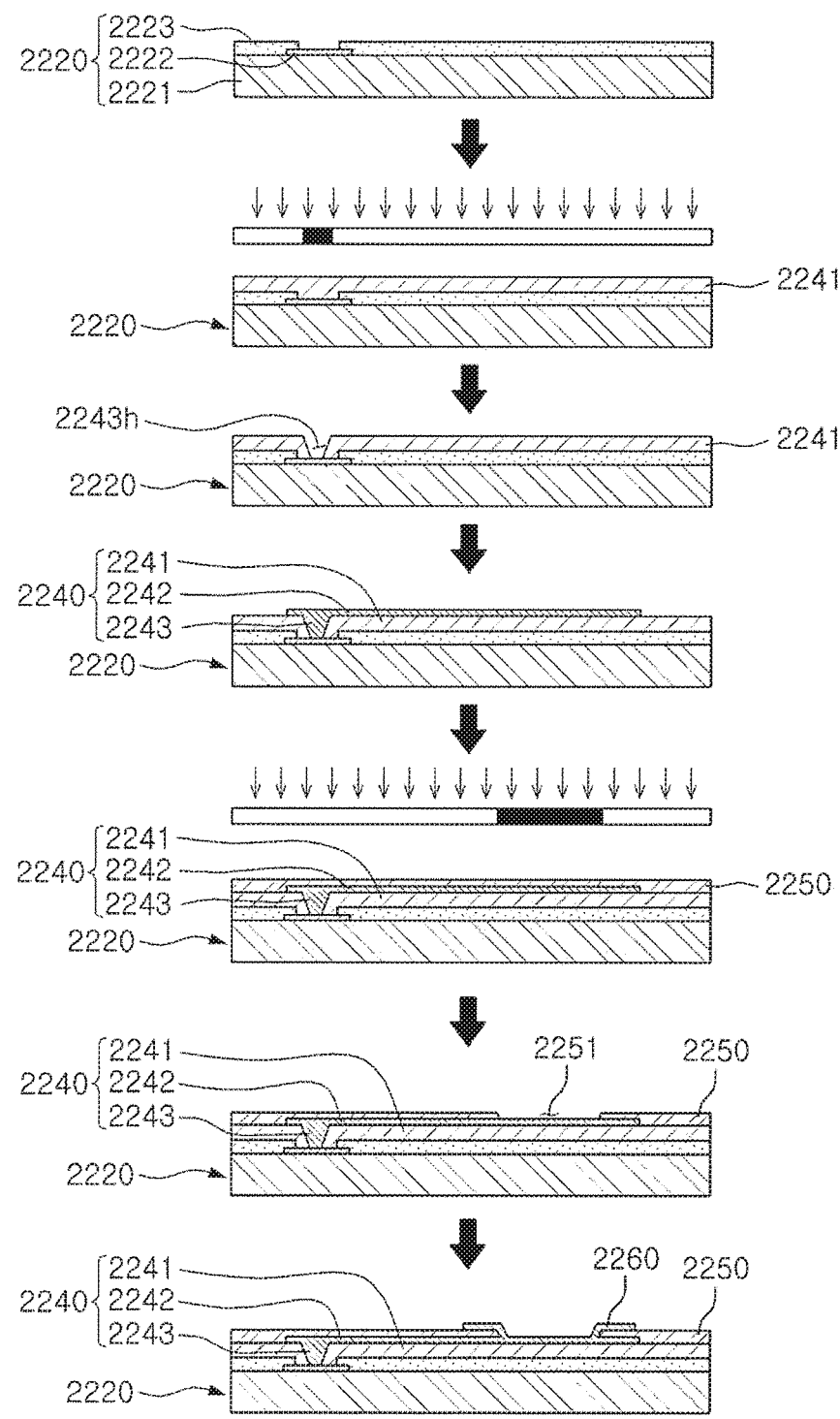
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit, (IC) in a bare state, including a body 2221 including silicon (Si), germanium (Ge), gallium arsenide (GaAs), the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
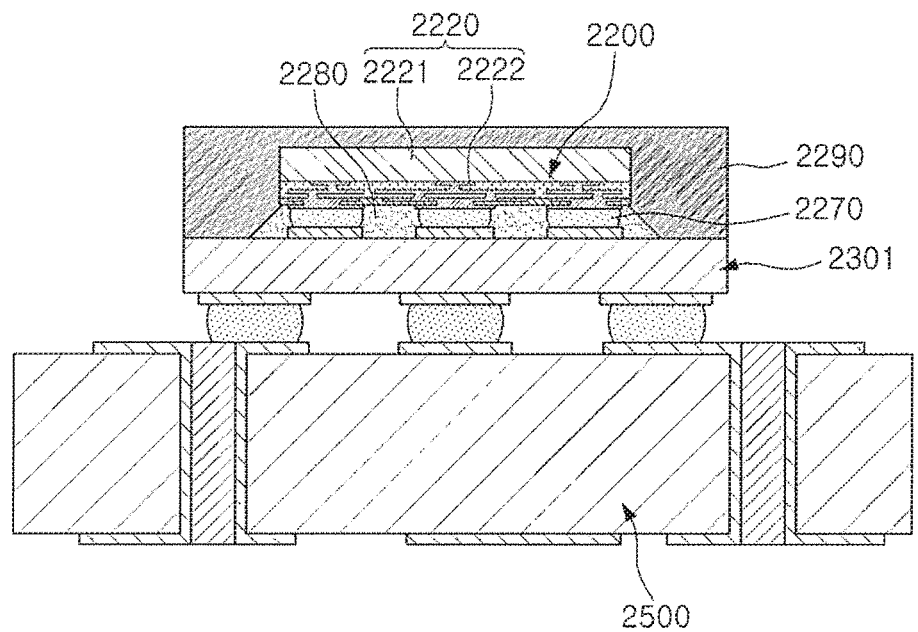
FIG. 5 is a schematic cross-sectional view illustrating a case in which a fan-in semiconductor package is mounted on a ball grid array (EGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
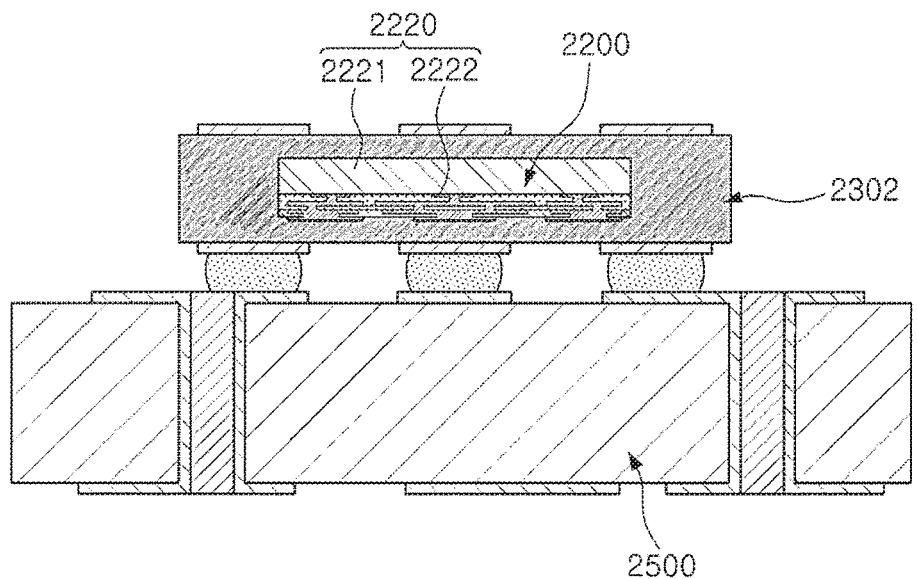
FIG. 6 is a schematic cross-sectional view illustrating a case in which a fan-in semiconductor package is embedded in a ball grid array (BGA) substrate and is ultimately mounted on a mainboard of an electronic device.

FIG. 6 is a schematic cross-sectional view illustrating a case in which a fan-in semiconductor package is embedded in a ball grid array (BGA) substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
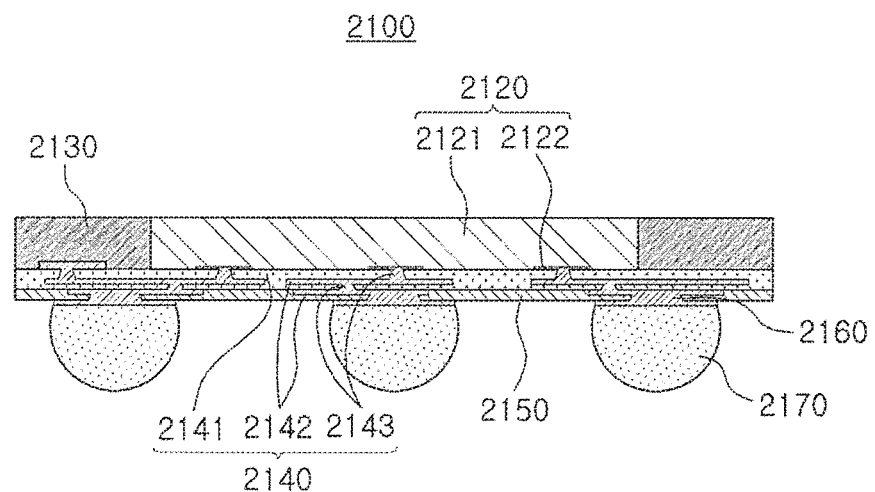
FIG. 7 is a cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chap 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
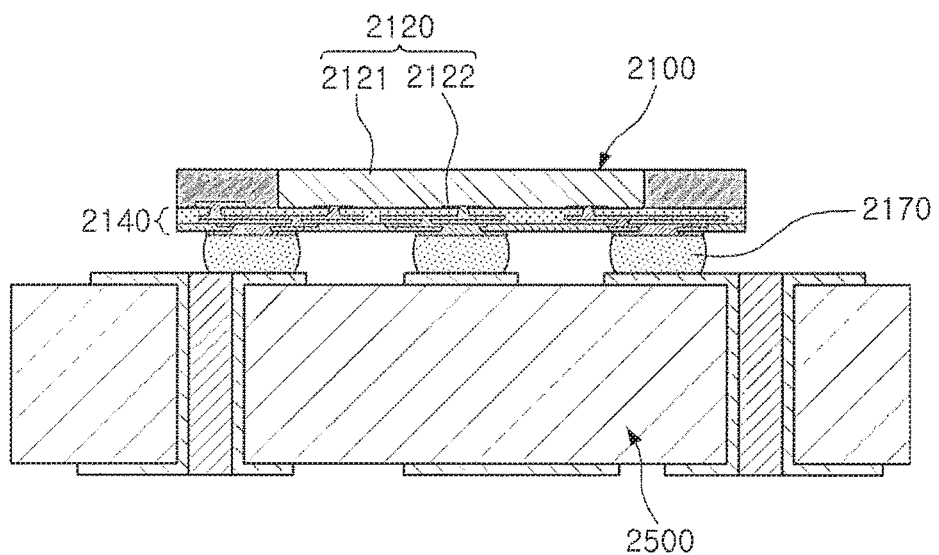
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate EGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from, those of the fan-out semiconductor package, and having the fan-in semiconductor package embedded therein.

Photoresist Developer Composition

Hereinafter, a photoresist developer composition used to manufacture the semiconductor package as described above will be described with reference to the accompanying drawings.

A photoresist developer composition according to an exemplary embodiment may contain a quaternary alkyl ammonium compound and a corrosion inhibitor, wherein the corrosion inhibitor contains a silane-based compound and an azole-based compound. If necessary, the photoresist developer composition may further contain a surfactant, a solvent, other additives, or the like.

As described above, photolithography is one of core processes in a manufacturing process of an electronic component such as a semiconductor or a liquid crystal display (LCD) panel. Generally, photolithography may be performed by exposing and developing a photoresist, and as a photoresist developer, a strong alkaline solution has been widely used. However, in a case of a strong alkaline solution simply including tetramethyl ammonium hydroxide (TMAH) developability is excellent, but there is a problem in that the strong alkaline solution attacks a wiring such as aluminum, and in a case of a strong alkaline solution such as KOH or NaOH, inorganic ions are liable to remain in a wiring, such that a substrate resistance problem may occur. In addition, aliphatic hydrocarbon compounds such as xylene is frequently used as a solvent in these strong alkaline solutions, but there is a problem such as harmfulness to human bodies at the time of handling or environmental contamination.

On the contrary, in the photoresist developer composition according to the exemplary embodiment, the strong alkaline solution is not simply used, but as the corrosion inhibitor, a silane-based compound may be added to the quaternary alkyl ammonium compound, and preferably, an azole-based compound may also be mixed and added thereto. Further, in order to improve solubility of the silane-based compound, a surfactant and a solvent may be further added thereto. In this case, as appreciated in an experimental result to be described below, a metal wiring or metal pad may be selectively protected, and a photoresist may be effectively developed.

Meanwhile, the photoresist developer composition according to the exemplary embodiment may preferably contain 2 to 4 wt % of the quaternary alkyl ammonium compound and 0.2 to 5 wt % of the corrosion inhibitor. Here, as the corrosion inhibitor, 0.1 to 3 wt % of the silane-based compound and 0.1 to 2 wt % of the azole-based compound may be contained. When the photoresist developer composition further contains the surfactant and the solvent, the photoresist developer composition may contain 0.01 to 1 wt % of the surfactant and 0.5 to 3 wt % of the solvent. In this case, the photoresist developer composition may have the above-mentioned effect without adverse effects. If necessary, the photoresist developer composition may further contain a suitable amount of other additives. The balance of the developer composition may be water, for example, pure water.

Hereinafter, each ingredient contained in the photoresist developer composition according to the exemplary embodiment will be described in more detail.

Quaternary Alkyl Ammonium Compound

The quaternary alkyl ammonium compound may serve to substantially develop a photoresist. The quaternary alkyl ammonium compound may be contained in the developer component in a content of 2 to 4 wt % and more preferably 2.5 to 3.5 wt %. When the content of the quaternary alkyl ammonium compound is higher than the above-mentioned content range, for example, higher than 4 wt %, corrosion may occur due to an increase in metal etching rate, and when the content is lower than the above-mentioned content range, for example, lower than 2 wt %, developability may be deteriorated. The quaternary alkyl ammonium compound may be, for example, tetraalkyl ammonium hydroxide. A more specifically, the quaternary alkyl ammonium compound may be at least one selected from tetramethyl ammonium hydroxide, tetraethyl ammonium hydroxide, tetrapropyl ammonium hydroxide, trimethylethyl ammonium hydroxide, ethyltrimethyl ammonium hydroxide, (2-hydroxyethyl)trimethyl ammonium hydroxide, (2-hydroxyethyl)triethyl ammonium hydroxide, (2-hydroxyethyl) tripropyl ammonium hydroxide, and (1-hydroxypropyl) trimethyl ammonium hydroxide, or a mixture thereof, but is not limited thereto.

Corrosion Inhibitor

Figure 9:
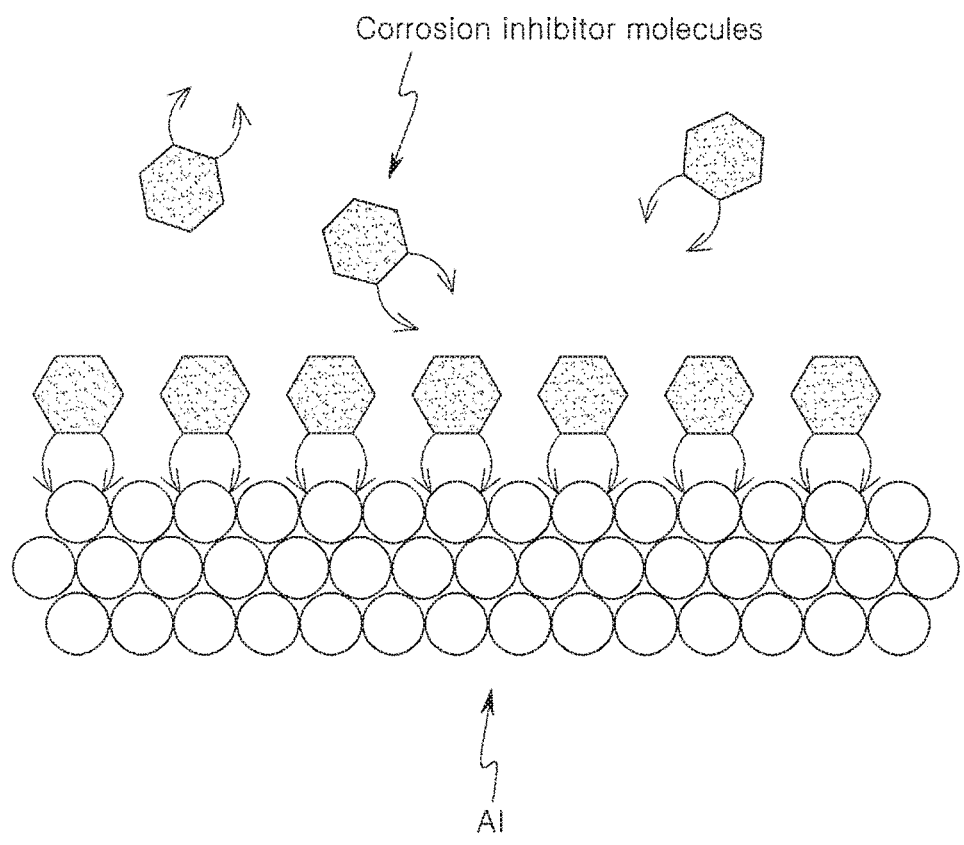
FIG. 9 schematically illustrates a corrosion inhibition mechanism of corrosion inhibitor molecules.

The corrosion inhibitor may serve to protect a metal wiring or metal pad. For example, the corrosion inhibitor according to the exemplary embodiment may be based on corrosion inhibition mechanism of corrosion inhibitor molecules illustrated in FIG. 9. As the corrosion inhibitor as described above, a mixture of the silane-based compound and the azole-based compound may be preferably used in view of excellent developability in addition to a corrosion inhibition effect. The corrosion inhibitor may be contained in the developer composition in a content of 0.2 to 5 wt % and more preferably 2 to 4 wt %. Here, as the corrosion inhibitor, the silane-based compound may be contained in a content of 0.1 to 3 wt % and more preferably 1.5 to 2.5 wt %, and the azole-based compound may be contained in a content of 0.1 to 2 wt % and more preferably 0.5 to 1.5 wt %. When the content of the corrosion inhibitor is lower than the above-mentioned content range, for example, lower than 0.2 wt %, the corrosion inhibition effect may be insufficient, and when the content is higher than the above-mentioned content range, for example, higher than 5 wt %, developability may be deteriorated.

The silane-based compound may be an alkoxy silane-based compound. More specifically, in view of excellent developability in addition to the corrosion inhibition effect, the silane-based compound may be preferably at least one compound selected from the group consisting of compounds represented by the following [Chemical Formula 1] to [Chemical Formula 4]. A mixture of these compounds may also be used.

[Chemical Formula 1]

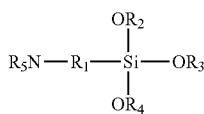

Here, $R_1$ is a substituted or unsubstituted ($C_1$ to $C_{10}$) aliphatic chain, $R_2$ to $R_4$ are each independently a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof, and $R_5$ is hydrogen, a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof. For example, the compound represented by [Chemical Formula 1] may be (3-aminopropyl)triethoxysilane, or the like, but is not limited thereto.

[Chemical Formula 2]

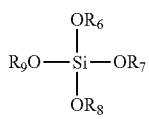

Here, $R_6$ to $R_9$ are each independently a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof For example, the compound represented by [Chemical Formula 2] may be tetraethyl orthosilicate, or the like, but is not limited thereto.

[Chemical Formula 3]

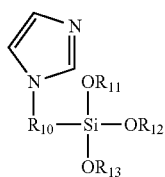

Here, $R_{10}$ is a substituted or unsubstituted ($C_1$ to $C_{10}$) aliphatic chain, and $R_{11}$ to $R_{13}$ are each independently a substituted or unsubstituted ($C_1$ to $C_{10}$) aliphatic chain, substituted or unsubstituted ($C_1$ to $C_{10}$) aliphatic ring, a substituted or unsubstituted ($C_6$ to $C_{20}$) aromatic ring, or a combination thereof. For example, the compound represent [Chemical Formula 3] may be triethoxy-3-(2-imidazolin-1-yl)propylsilane, or the like, but is not limited thereto.

[Chemical Formula 4]

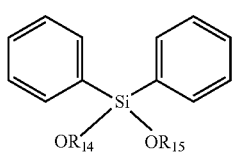

Here, $R_{14}$ and $R_{15}$ are each independently a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof. For example, the compound represented by [Chemical Formula 4] may be diethoxydiphenylsilane, or the like, but is not limited thereto.

The azole-based compound may be at least one compound selected from the group consisting of a benzotriazole-based compound, a benzothiazole-based compound, and a pyrazole-batted compound. More specifically, in view of excellent developability in addition to the corrosion inhibition effect, the azole-based compound may be preferably at least one compound selected from the group consisting of compounds represented by the following [Chemical Formula 5] to [Chemical Formula 8]. A mixture of these compounds may also be used.

[Chemical Formula 5]

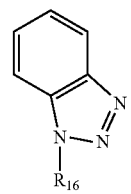

Here, $R_{16}$ is hydrogen, a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof. For example, the compound represented by [Chemical Formula 5] may be 1-methylbenzotriazole, benzotriazole, or the like, but is not limited thereto.

[Chemical Formula 6]

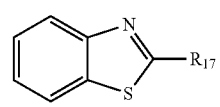

Here, $R_{17}$ is hydrogen, a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof. For example, the compound represented by [Chemical Formula 6] may be benzothiazole, or the like, but is not limited thereto.

[Chemical Formula 7]

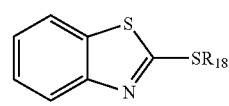

Here, $R_{18}$ is hydrogen, a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof. For example, the compound represented by [Chemical Formula 7] may be 2-mercaptobenzothiazole, or the like, but is not limited thereto.

[Chemical Formula 8]

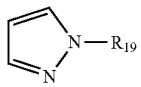

Here, $R_{19}$ is hydrogen, a substituted or unsubstituted ($C_1$ to $C_{10}$) aliphatic chain, a substituted or unsubstituted. ($C_1$ to $C_{10}$) aliphatic ring, a substituted or unsubstituted ($C_6$ to $C_{20}$) aromatic ring, or a combination thereof. For example, the compound represented by [Chemical Formula 8] may be pyrazole, the like, but is not limited thereto.

Meanwhile, an aliphatic chain, which means a linear or branched chain aliphatic compound, may be, for example, saturated or unsaturated hydrocarbon, alkoxy, alkyl ester, alkyl ether, thioalkyl, or the like, but is not limited thereto. Here, the aliphatic chain may include at least one substituent in a main chain and/or a side chain, wherein the substituent may be, for example, halogen, oxygen, sulfur, nitrogen, a hydroxyl group, a carboxyl group, an alkyl group, a haloalkyl group, a nitro group, a cyano group, an ester group, an ether group, an amide group, an imide group, an alkoxy group, or a combination thereof, but is not limited thereto.

Further, an aliphatic ring, which means a cyclic aliphatic compound, may be a monocyclic compound or a polycyclic compound formed by condensation of two or more rings, for example, a saturated or unsaturated hydrocarbon ring such as cycloalkyl. The aliphatic ring may include at least one substituent, wherein the substituent may be, for example, halogen, oxygen, sulfur, nitrogen, a hydroxyl group, a carboxyl group, an alkyl group, a haloalkyl group, a nitro group, a cyano group, an ester group, an ether group, an amide group, an imide group, an alkoxy group, or a combination thereof, but is not limited thereto.

In addition, an aromatic ring, which means a cyclic aromatic compound, may be a monocyclic compound or a polycyclic compound formed by condensation of two or more rings. For example, the aromatic ring may be aryl such as phenyl, naphthalene, or the like. The aromatic ring may include at least one substituent, wherein the substituent may be, for example, halogen, oxygen, sulfur, nitrogen, a hydroxyl group, a carboxyl group, an alkyl group, a haloalkyl group, a nitro group, a cyano group, an ester group, an ether group, an amide group, an imide group, an alkoxy group, or a combination thereof, but is not limited thereto.

Solvent

The solvent may be used in order to improve solubility of the silane-based compound. To this end, N-methyl-2-pyrrolidone, isopropyl alcohol, or the like, may be used in this case, a problem such as harmfulness to human bodies or environmental contamination may be decreased. The solvent may be contained in the developer composition in a content of 0.5 to 3 wt % and preferably 1 to 3 wt %.

Surfactant

The surfactant may serve to prevent corrosion and improve solubility of the silane-based compound. The surfactant may be contained in the developer composition in a content of 0.01 to 1 wt % and preferably 0.03 to 0.5 wt %. The content of the surfactant needs to be adjusted depending on a molecular weight. However, when the content of the surfactant is higher than the above-mentioned range, for example, higher than 1 wt %, developability may be deteriorated. The surfactant may be, for example, polyalkylene glycol alky ether. More specifically, the surfactant may be at least one compound selected from the group consisting of compounds represented by the following [Chemical Formula 9]. A mixture of these compounds may also be used.

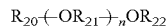

[Chemical Formula 9]

Here, $R_{20}$ to $R_{22}$ are each independently a substituted or unsubstituted ($C_1$ to $C_{10}$) aliphatic chain, and n is an integer of 10 to 30. For example, the compound represented by [Chemical Formula 9] may be polyethylene glycol alkyl ether, but is not limited thereto.

Meanwhile, an aliphatic chain, which means a linear or branched chain aliphatic compound, may be, for example, saturated or unsaturated hydrocarbon, alkoxy, alkyl ester, alkyl ether, thioalkyl, or the like, but is not limited thereto. Here, the aliphatic chain may include at least one substituent in a main chain and/or a side chain, wherein the substituent may be, for example, halogen, oxygen, sulfur, nitrogen, a hydroxyl group, a carboxyl group, an alkyl group, a haloalkyl group, a nitro group, a cyano group, an ester group, an ether group, an amide group, an imide group, an alkoxy group, or a combination thereof, but is not limited thereto.

pH

Next, a pH of the photoresist developer composition according to the exemplary embodiment may about 12 to 14 and more preferably about 13 to 13.5. Developing performance for the photoresist may be more excellent under the pH condition as described above.

Inventive Examples and Comparative Example

First, photoresist developer compositions containing ingredients each having a content illustrated in the following [Table 1] and the balance being water were prepared, respectively. Meanwhile, in Examples 1 and 2, for stability of a developer, after dissolving a solvent and/or a surfactant in a quaternary ammonium salt solution, a corrosion inhibitor was sequentially added thereto to thereby prepare the photoresist developer composition, but a sequence is not limited thereto.

TABLE 1

| Classification | Comparative Example | Inventive Example 1 | Inventive Example 2 |
|---|---|---|---|
| Quaternary Ammonium Salt | TMAH 2.38 wt % | TMAH 2.7 wt % | TMAH 3.3 wt % |
| Corrosion Inhibitor | — | Tetraethyl orthosilicate 1.75 wt % | Tetraethyl orthosilicate 2 wt % |
|  | — | Benzotriazole 1 wt % | Benzotriazole 1 wt % |
| Organic Solvent | — | — | N-Methyl-2-pyrrolidone 1 wt % |
| Surfactant | — | — | Polyethylene glycol alkyl ethers 0.03 wt % |

A metal etching rate and developability were measured using each of the prepared developer compositions in Comparative Example and Inventive Examples 1 and 2, and the results are illustrated in the following [Table 2]. Meanwhile, in an experiment, as a metal, aluminum (Al) was used, and as a photoresist, a photo imageable dielectric (PID) material used as a build-up layer for forming a re-distribution layer (RDL) in a semiconductor package was used.

TABLE 2

|  | pH | Al Etching rate (nm/min) | Developability | Al Attack |
|---|---|---|---|---|
| Comparative Example | 13.3 | 32.7 | OK | Negative |
| Inventive Example 1 | 13.01 | 4.56 | OK | OK |
| Inventive Example 2 | 13.17 | 5.16 | OK | OK |

Figure 10:
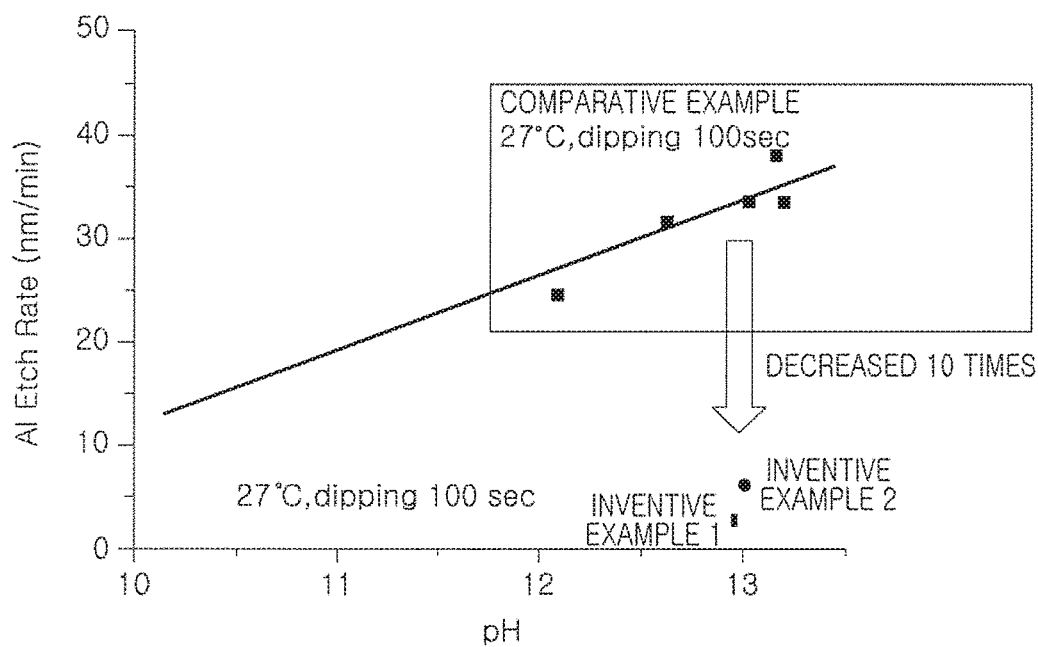
FIG. 10 schematically illustrates metal etching rates of developer compositions in Inventive Examples 1 and 2 based on a metal etching rate of a developer composition in Comparative Example.
Figure 11A:
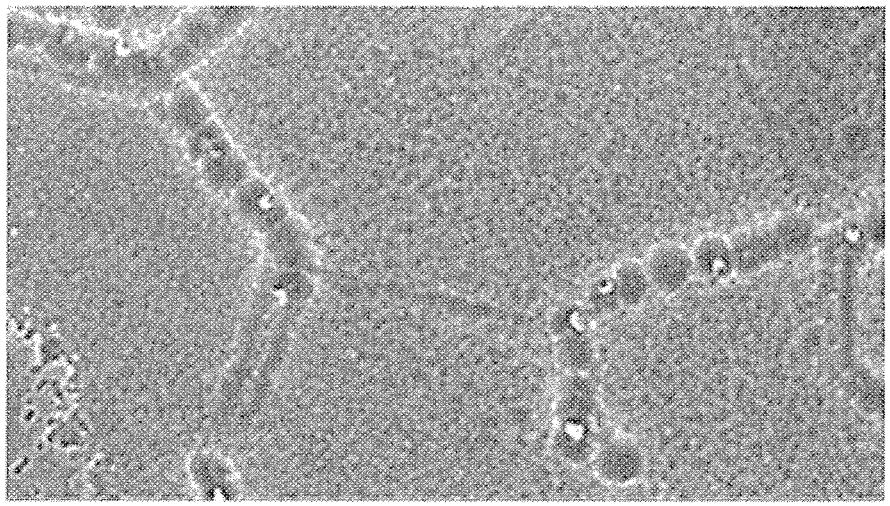
FIGS. 11A and 11B schematically illustrate a metal protection result and a photoresist development result of the developer composition in Comparative Example, respectively.
Figure 11B:
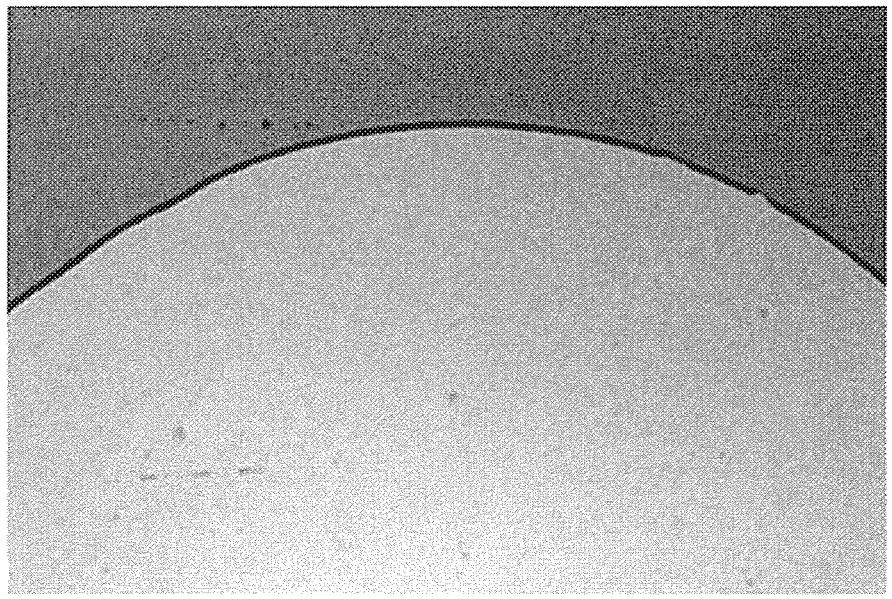
Figure 12A:
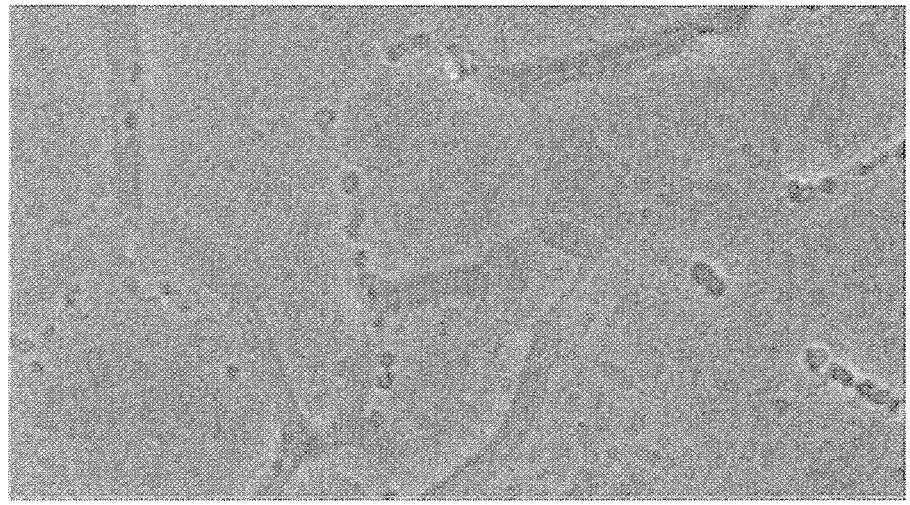
FIGS. 12A and 12B schematically illustrate a metal protection result and a photoresist development result of the developer composition in Inventive Example 1, respectively.
Figure 12B:
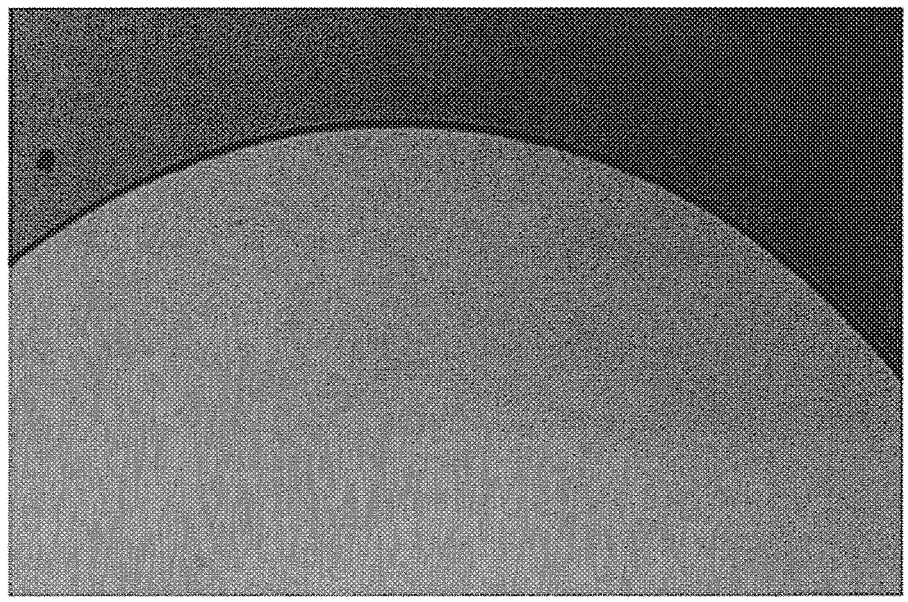
Figure 13A:
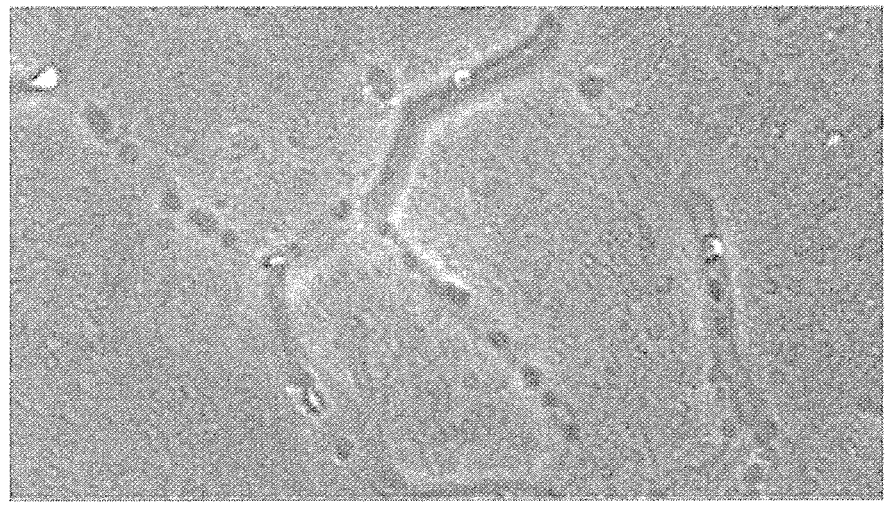
FIGS. 13A and 13B schematically illustrate a metal protection result and a photoresist development result of the developer composition in Inventive Example 2, respectively.
Figure 13B:
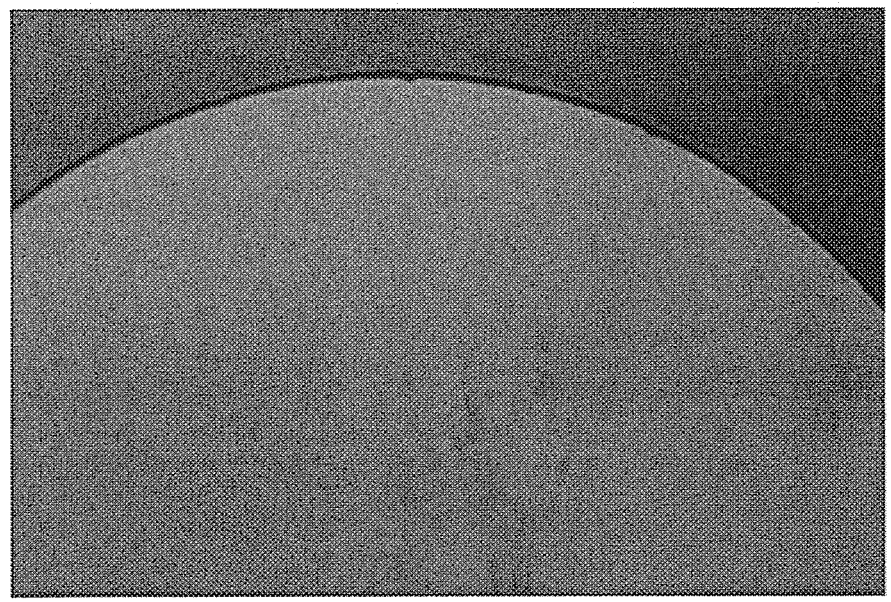

As illustrated in experimental results in [Table 2], it may be appreciated that in Inventive Examples 1 and 2, an aluminum etching rate was significantly low as compared to Comparative Example, but developability was equivalent to that in Comparative Example. These results are illustrated as a graph in FIG. 10. That is, it may be appreciated that the developer compositions in Inventive Examples 1 and 2 may effectively develop the photoresist such as PID without attacking aluminum. This result may be appreciated from FIGS. 11A through 13B. FIGS. 11A and 11B schematically illustrate a metal protection result and a photoresist development result of the developer composition in Comparative Example, respectively, FIGS. 12A and 12B schematically illustrate a metal protection result and a photoresist development result of the developer composition in Inventive Example 1, respectively, and FIGS. 13A and 13B schematically illustrate a metal protection result and a photoresist development result of the developer composition in Inventive Example 2, respectively.

Next in order to confirm performance of the corrosion inhibitor in the developer composition suggested in the present disclosure in more detail, photoresist developer compositions containing ingredients each having a content illustrated in the following [Table 3] and the balance being water were further prepared, respectively.

TABLE 3

| Classification | Reference Example 1 | Reference Example 2 | Reference Example 3 |
|---|---|---|---|
| Quaternary Ammonium Salt | TMAH 2.38 wt % | TMAH 2.38 wt % | TMAH 2.38 wt % |
| Corrosion Inhibitor | — | Benzotriazole 4 wt % | 1-Methylbenzotriazole 2% |
|  | Benzotriazole 2 wt % |  |  |
| Organic Solvent | — | N-Methyl-2-pyrrolidone 3 wt % | N-Methy1-2-pyrrolidone 1 wt % |
| Surfactant | — | — | Polyethylene glycol alkyl ethers 0.03 wt % |

A metal etching rate and developability were measured using each of the prepared developer compositions in Reference Examples 1 to 3, and the results are illustrated in the following [Table 4]. Meanwhile, in an experiment, as a metal, aluminum (Al) was used, and as a photoresist, a photo imageable dielectric (PID) material used as a build-up layer for forming a re-distribution layer (RDL) in a semiconductor package was used.

TABLE 4

|  | pH | Al Etching rate (nm/min) | Developability | Al Attack |
|---|---|---|---|---|
| Reference Example 1 | 3.8 | 31.4 | Negative | Negative |
| Reference Example 2 | 8.9 | 14.3 | Negative | Negative |
| Reference Example 3 | 13.4 | 33.57 | OK | Negative |

As illustrated, in experimental results in [Table 4], it may be appreciated that in a case of using an azole-based compound alone as a corrosion inhibitor, an effect of preventing attacks on aluminum was insufficient, and in a case of increasing a content of the azole-based compound in order to improve the effect of preventing attacks on aluminum, it was impossible to develop the PID due to a decrease in pH. That is, it may be appreciated that as the corrosion inhibitor, the silane-based compound as a main ingredient and the azole-based compound as an auxiliary ingredient may be preferably used in suitable contents. For example, it is preferable to use a combination in which the silane-based compound is added in a higher content than that of the azole-based compound.

As described above, in a case of using the photoresist developer composition according to the exemplary embodiment in the present disclosure, the photoresist developer composition may selectively protect a metal layer and remove the photoresist without deteriorating developability in a photoresist developing process of a recision component, thereby serving to improve adhesion with an insulating layer or plating layer formed on the metal layer and decrease resistance in subsequent plating and packaging process. Further, in a case of using an inorganic alkaline solution such as KOH as a developer in order to selectively protect a metal layer, metal ions are liable to remain in a metal wiring, such that a resistance problem may occur later. However, at the time of using a photoresist developer according to the exemplary embodiment in the present disclosure, the photoresist developer may be easily removed after the process, such that the photoresist developer does not remain. Further, in a case of an organic solvent type developer, the metal layer may be protected, and developability may be secured, but the organic solvent type developer may be harmful to human bodies due to high volatility, a process may be dangerous, and at the time of treating a waste solution, an environmental problem may occur. However, in the case of using the photoresist developer according to the exemplary embodiment in the present disclosure, these problems may be solved.

Therefore, the photoresist developer composition according to the exemplary embodiment in the present disclosure described above may be easily used to manufacture the above-mentioned semiconductor package. For example, the photoresist developer composition may be easily used as developer for forming the via holes 2243*h* opening the connection pads 2222 in the insulating layer 2241 at the time of forming the above-mentioned connection member 2240 of FIGS. 3A and 3B. Further, the photoresist developer composition may also be easily used as a developer for forming via holes (not denoted by a reference numeral) opening the connection pads 2122 in the insulating layer 2141 at the time of forming the above-mentioned connection member 2140 of FIG. 7 in a manufacturing method of a semiconductor package including: preparing a semiconductor chip having an active surface on which connection pads are disposed and an inactive surface opposing the active surface; a forming a photoresist on the active surface of the semiconductor chip; and developing the photoresist, the photoresist developer composition according to the exemplary embodiment in the present disclosure as described above may be easily used as a developer in the developing of the photoresist.

As set forth above, according to exemplary embodiments in the present disclosure, a novel developer composition capable of effectively developing the photoresist while selectively protecting the metal wiring or metal pad formed of aluminum (Al) or copper (Cu) may be provided.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

While exemplary embodiments have been shown and described above, it will be apparent to those skilled in the art that modifications and variations could be made without departing from the scope of the present invention as defined by the appended claims.

What is claimed is:

1. A photoresist developer composition comprising:
2 to 4 wt % a quaternary alkyl ammonium compound;
1.5 to 3 wt % of a silane-based compound; and
0.1 to 2 wt % of an azole-based compound,
wherein a content of the silane-based compound is greater than a content of the azole-based compound.

2. The photoresist developer composition of claim 1, wherein the quaternary alkyl ammonium compound includes tetraalkyl ammonium hydroxide.

3. The photoresist developer composition of claim 1, wherein the silane-based compound is an alkoxy silane-based compound.

4. The photoresist developer composition of claim 3, wherein the silane-based compound is at least one compound selected from the group consisting of compounds represented by the following [Chemical Formula 1] to [Chemical Formula 4]:

[Chemical Formula 1]

in [Chemical Formula 1], $R_1$ is a substituted or unsubstituted ($C_1$ to $C_{10}$) aliphatic chain, $R_2$ to $R_4$ are each independently a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof, and $R_5$ is hydrogen, a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof,

[Chemical Formula 2]

in [Chemical Formula 2], $R_6$ to $R_9$ are each independently a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof,

[Chemical Formula 3]

in [Chemical Formula 3], $R_{10}$ is a substituted or unsubstituted ($C_1$ to $C_{10}$) aliphatic chain, and $R_{11}$ to $R_{13}$ are each independently a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof, and

[Chemical Formula 4]

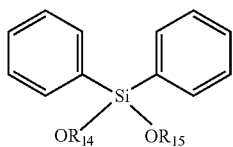

in [Chemical Formula 4], $R_{14}$ and $R_{15}$ are each independently a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof.

5. The photoresist developer composition of claim 1, wherein the azole-based compound is at least one compound selected from the group consisting of a benzotriazole-based compound, a benzothiazole-based compound, and a pyrazole-based compound.

6. The photoresist developer composition of claim 5, wherein the azole-based compound is at least one compound selected from the group consisting of compounds represented by [Chemical Formula 5] to [Chemical Formula 8]:

[Chemical Formula 5]

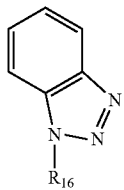

in [Chemical Formula 5], $R_{16}$ is hydrogen, a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof,

[Chemical Formula 6]

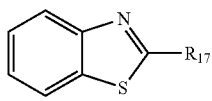

in [Chemical Formula 6], $R_{17}$ is hydrogen, a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof,

[Chemical Formula 7]

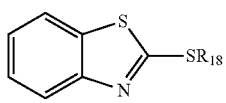

in [Chemical Formula 7], $R_{18}$ is hydrogen, a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, and

[Chemical Formula 8]

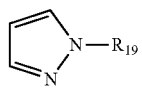

in [Chemical Formula 8], $R_{19}$ is hydrogen, a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof.

7. The photoresist developer composition of claim 1, further comprising a solvent.

8. The photoresist developer composition of claim 7, wherein the solvent is contained in a content of 0.5 to 3 wt %.

9. The photoresist developer composition of claim 7, wherein the solvent includes at least one selected from the group consisting of N-methyl-2-pyrrolidone and isopropyl alcohol.

10. The photoresist developer composition of claim 1, further comprising a surfactant.

11. The photoresist developer composition of claim 10, wherein the surfactant is contained in a content of 0.01 to 1 wt %.

12. The photoresist developer composition of claim 10, wherein the surfactant is polyalkylene glycol alkyl ether.

13. The photoresist developer composition of claim 12, wherein the surfactant is a compound represented by the following [Chemical Formula 9]:

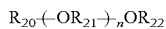   [Chemical Formula 9]

in [Chemical Formula 9], $R_{20}$ to $R_{22}$ are each independently a substituted or unsubstituted ($C_1$ to $C_{10}$) aliphatic chain, and n is an integer of 10 to 30.

14. The photoresist developer composition of claim 1, wherein a pH of the photoresist developer composition is 12 to 14.

15. The photoresist developer composition of claim 1, wherein the azole-based compound is at least one compound represented by the following [Chemical Formula 5]:

[Chemical Formula 5]

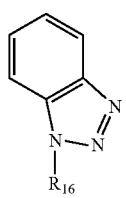

wherein, in [Chemical Formula 5], $R_{16}$ is hydrogen, a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof.

16. The photoresist developer composition of claim 1, wherein the silane-based compound is represented by the following [Chemical Formula 2]:

[Chemical Formula 2]

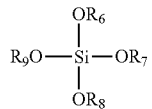

wherein, in [Chemical Formula 2], $R_6$ to $R_9$ are each independently a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof.

17. The photoresist developer composition of claim 15, wherein the silane-based compound is represented by the following [Chemical Formula 2]:

[Chemical Formula 2]

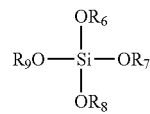

wherein, in [Chemical Formula 2], $R_6$ to $R_9$ are each independently a substituted or unsubstituted ($C_1$ to $C_{10}$) aliphatic chain, a substituted or unsubstituted ($C_1$ to $C_{10}$) aliphatic ring, a substituted or unsubstituted ($C_6$ to $C_{20}$) aromatic ring, or a combination thereof.

18. A manufacturing method of a semiconductor package, the manufacturing method comprising:
preparing a semiconductor chip having an active surface on which connection pads are disposed and an inactive surface opposing the active surface;
forming a photoresist on the active surface of the semiconductor chip and exposing the photoresist; and
developing the photoresist by applying the photoresist developer composition according to claim 1 to the exposed photoresist.

\* \* \* \* \*